(12) United States Patent
Borkum et al.

(10) Patent No.: US 11,068,545 B2
(45) Date of Patent: Jul. 20, 2021

(54) SPATIAL IDENTIFICATION OF ASSETS USING N-DIMENSIONAL ASSET IDENTIFIERS

(71) Applicant: BATTELLE MEMORIAL INSTITUTE, Richland, WA (US)

(72) Inventors: Mark I. Borkum, Richland, WA (US); Na Wang, Arlington, VA (US); Efthimios Alexandros Vlachokostas, Arlington, VA (US); Harry Bergmann, Washington, DC (US)

(73) Assignee: BATTELLE MEMORIAL INSTITUTE, Richland, WA (US)

( * ) Notice: Subject to any disclaimer, the term of this patent is extended or adjusted under 35 U.S.C. 154(b) by 348 days.

(21) Appl. No.: 16/191,829

(22) Filed: Nov. 15, 2018

(65) Prior Publication Data

US 2019/0155847 A1    May 23, 2019

Related U.S. Application Data

(60) Provisional application No. 62/587,611, filed on Nov. 17, 2017.

(51) Int. Cl.
*G06F 16/909*    (2019.01)
*G06F 16/29*    (2019.01)
*G06F 30/00*    (2020.01)

(52) U.S. Cl.
CPC ............ *G06F 16/909* (2019.01); *G06F 16/29* (2019.01); *G06F 30/00* (2020.01)

(58) Field of Classification Search
CPC .... G06F 16/29; G06F 16/2264; G06F 16/909; G06F 30/00
See application file for complete search history.

(56) References Cited

U.S. PATENT DOCUMENTS

| 7,428,525 | B1 | 9/2008 | Grasteit | |
| 8,269,767 | B2 * | 9/2012 | Glueck | G06T 19/00 345/419 |
| 9,020,941 | B1 | 4/2015 | Gupta et al. | |
| 9,280,899 | B2 * | 3/2016 | Biess | G08G 1/163 |

(Continued)

FOREIGN PATENT DOCUMENTS

JP    2002538218 A    11/2002

OTHER PUBLICATIONS

International Search Report/Written Opinion for International Application No. PCT/US2018/061479, International Filing Date 2018-16, dated Mar. 5, 2019.

*Primary Examiner* — Angelica Ruiz
(74) *Attorney, Agent, or Firm* — Derek H. Maughan

(57) ABSTRACT

Described herein are methods, systems, and storage media having computer-processable instructions for assigning an n-dimensional asset identifier to an asset (n≥3). The identifier can be generated by determining a position of the asset in n dimensions, wherein the position is based at least on the center of mass of the asset's geometry. Extents are determined for each of the n dimensions, wherein each extent is measured from the center of mass to a surface of an n-dimensional bounding polytope containing the asset. The position and the extents of the asset can then be encoded or embedded into a single, non-opaque, code string. The position and the extent information are intrinsic to the string.

11 Claims, 5 Drawing Sheets

(56) References Cited

U.S. PATENT DOCUMENTS

| | | |
|---|---|---|
| 2006/0293840 A1* | 12/2006 | Klein .................... G08G 5/0095 |
| | | 701/533 |
| 2007/0282482 A1 | 12/2007 | Beucher et al. |
| 2010/0049770 A1* | 2/2010 | Ismalon ............. G06Q 30/0269 |
| | | 707/765 |
| 2015/0095336 A1 | 4/2015 | Green et al. |
| 2015/0269770 A1* | 9/2015 | Jenkins ................... G06T 15/20 |
| | | 345/421 |
| 2018/0239948 A1* | 8/2018 | Rutschman ............... G06T 7/20 |

\* cited by examiner

SPATIAL IDENTIFICATION OF ASSETS USING N-DIMENSIONAL ASSET IDENTIFIERS

CROSS-REFERENCE TO RELATED APPLICATIONS

This invention claims priority from provisional patent application No. 62/587,611, entitled Unique Building Identification, filed Nov. 17, 2017. The application is incorporated herein by reference.

ACKNOWLEDGEMENT OF GOVERNMENT SUPPORT

This invention was made with Government support under Contract DE-AC0576RL01830 awarded by the U.S. Department of Energy. The Government has certain rights in the invention.

FIELD

The present disclosure relates generally to geographic information systems and to grid reference systems, and more particularly to spatially identifying assets or spatially and temporally identifying assets.

BACKGROUND

Spatially identifying and tracking an asset, such as a building, is a fundamental capability that can enable many industrial applications. Traditionally, assets have been conceived of as occupying a place or location and, therefore, have been identified with a street address or a geographic coordinate point. These kinds of systems have many insufficiencies when attempting to uniquely identify assets, to append and join data from disparate sources, and to computationally process asset identifiers efficiently (especially when processing large quantities of identifiers). Examples of insufficiencies can include, but are not limited to address name duplicates, computationally taxing data structures, disparate identification schemes, and difficult-to-interpret, opaque identifier formats. An identification scheme can refer to a method of assigning identifiers to records in a set. The term "disparate" implies that said schemes are essentially different, i.e., incompatible with one another. Accordingly, a need exists for methods, systems, and non-transitory computer-readable storage media for spatially, or spatially and temporally, identifying an asset in a manner that overcomes limitations of traditional approaches to facilitate adoption across many industries and integration into many applications.

SUMMARY

Disclosed are methods, systems, and non-transitory computer-readable storage media for assigning an n-dimensional asset identifier to an asset (n≥3). The embodiments disclosed herein can provide asset identifiers that are unique, standardized, computationally efficient, non-opaque, and scalable. The identifiers have at least a spatial aspect for the asset. Some embodiments can further have additional aspects including, but not limited to, a temporal aspect.

In some embodiments, a method of assigning an n-dimensional asset identifier to an asset comprises determining a position of the asset in n dimensions (n≥3), wherein the position is based at least on the center of mass of the asset's modeled geometry; determining an extent for each of the n dimensions, wherein each extent is measured from the center of mass to a surface of an n-dimensional bounding polytope containing the asset; and encoding the position and the extents of the asset into a single, non-opaque, code string that can be stored on computer-readable media. In certain embodiments, the asset is a building, a floor of a building, a room in a building, building HVAC equipment, building electrical equipment, building mechanical equipment, valuable inventory, an art artifact, a monument, a landmark, a buildable area or volume, a vehicle, a telecommunications installation, a basic infrastructure installation, a person, or a combination thereof. In certain embodiments, the method can further comprise referencing the position and extents to a grid reference system having n-dimensions, wherein the grid reference system comprises uniform, non-overlapping grid cells and overlays at least a portion of Earth's surface. In certain embodiments, each position within the portion of the Earth's surface is within exactly one grid cell and has one unit of extent in length, width, and height dimensions. In certain embodiments, one of the n dimensions of the grid system is height and the method further comprises the steps of: defining a stratum as a span between a fixed minimum height and a fixed maximum height at a higher altitude than the minimum height, wherein no polytope extends outside the stratum; and sub-dividing the stratum into nested layers, wherein increasingly nested layers correspond to finer resolutions. In certain embodiments, the method can further comprise contributing one symbol to the non-opaque code string for each nested layer. In certain embodiments, the polytope is a hyperrectangle. In certain embodiments, the n dimensions comprise length, width, and height. In certain embodiments, the n dimensions comprise length, width, and time. In certain embodiments, n is greater than or equal to four and the n dimensions comprise length, width, height, and time. In certain embodiments, the method can further comprise not encoding the asset's geometry into the non-opaque, code string. In certain embodiments, a plurality of single, non-opaque, code strings are comparable for functional equivalence. In certain embodiments, said step of determining a position is based on a map image.

In some embodiments, a method of assigning an n-dimensional asset identifier to an asset comprises defining a stratum as a span between a fixed minimum height and a fixed maximum height at a higher altitude than the minimum height; sub-dividing the stratum into nested layers, wherein increasingly nested layers correspond to finer resolutions; determining from a map, a position of the asset in n dimensions (n≥3) comprising length, width, and height, wherein the position is based on the center of mass of the asset's geometry; determining an extent for each of the dimensions, wherein each extent is measured from the center of mass to a surface of an n-dimensional bounding hyperrectangle containing the asset, wherein no bounding hyperrectangle extends outside the stratum; referencing the position and extents to a grid system having n-dimensions, wherein the grid system comprises uniform, non-overlapping grid cells and overlays at least a portion of Earth's surface; and encoding the position and the extents of the asset into a single, non-opaque, code string that can be stored on computer-readable media, wherein the code string does not encode the asset's geometry and wherein two non-opaque, code strings are directly comparable for functional equivalence.

In some embodiments, a non-transitory computer readable storage medium can store one or more programs, the one or more programs comprises instructions, which when executed by one or more processors of an electronic device cause the device to determine a position of an asset in n dimensions (n≥3), wherein the position is based at least on the center of mass of the asset's geometry; determine an extent for each of the n dimensions, wherein each extent is measured from the center of mass to a surface of an n-dimensional bounding polytope containing the asset; and encode the position and the extents of the asset into a single, non-opaque, code string that is a computer-readable, n-dimensional identifier of the asset. In certain embodiments, the non-transitory computer readable storage medium stores programs comprising instructions, which when executed further cause the electronic device to reference the position and extents to a grid reference system having n-dimensions, wherein the grid system comprises uniform, non-overlapping grid cells and overlays at least a portion of Earth's surface. In certain embodiments, the non-transitory computer readable storage medium stores programs comprising instructions, which when executed further cause the electronic device to define a stratum as a span between a fixed minimum height and a fixed maximum height at a higher altitude than the minimum height, wherein no polytope extends outside the stratum; and sub-divide the stratum into nested layers, wherein increasingly nested layers correspond to finer resolutions. In certain embodiments, the n dimensions comprise length, width, and time. In certain embodiments, the non-transitory computer readable storage medium stores programs comprising instructions, which when executed cause the electronic device to encode the position and the extents of the asset into a single, non-opaque, code string do not encode the asset's geometry into the non-opaque, code string. In certain embodiments, two single, non-opaque, code strings are directly comparable for functional equivalence.

In certain embodiments, the non-transitory computer readable storage medium stores programs comprising instructions, which when executed further cause the electronic device to concatenate the non-opaque code string by removing any symbol not associated with dimensions of length and width.

The purpose of the foregoing summary and the latter abstract is to enable the United States Patent and Trademark Office and the public, especially the scientists, engineers, and practitioners in the art who are not familiar with patent or legal terms or phraseology, to determine quickly from a cursory inspection the nature and essence of the technical disclosure of the application. Neither the summary nor the abstract is intended to define the invention of the application, which is measured by the claims, nor is it intended to be limiting as to the scope of the claims in any way.

DETAILED DESCRIPTION

Figure 1:
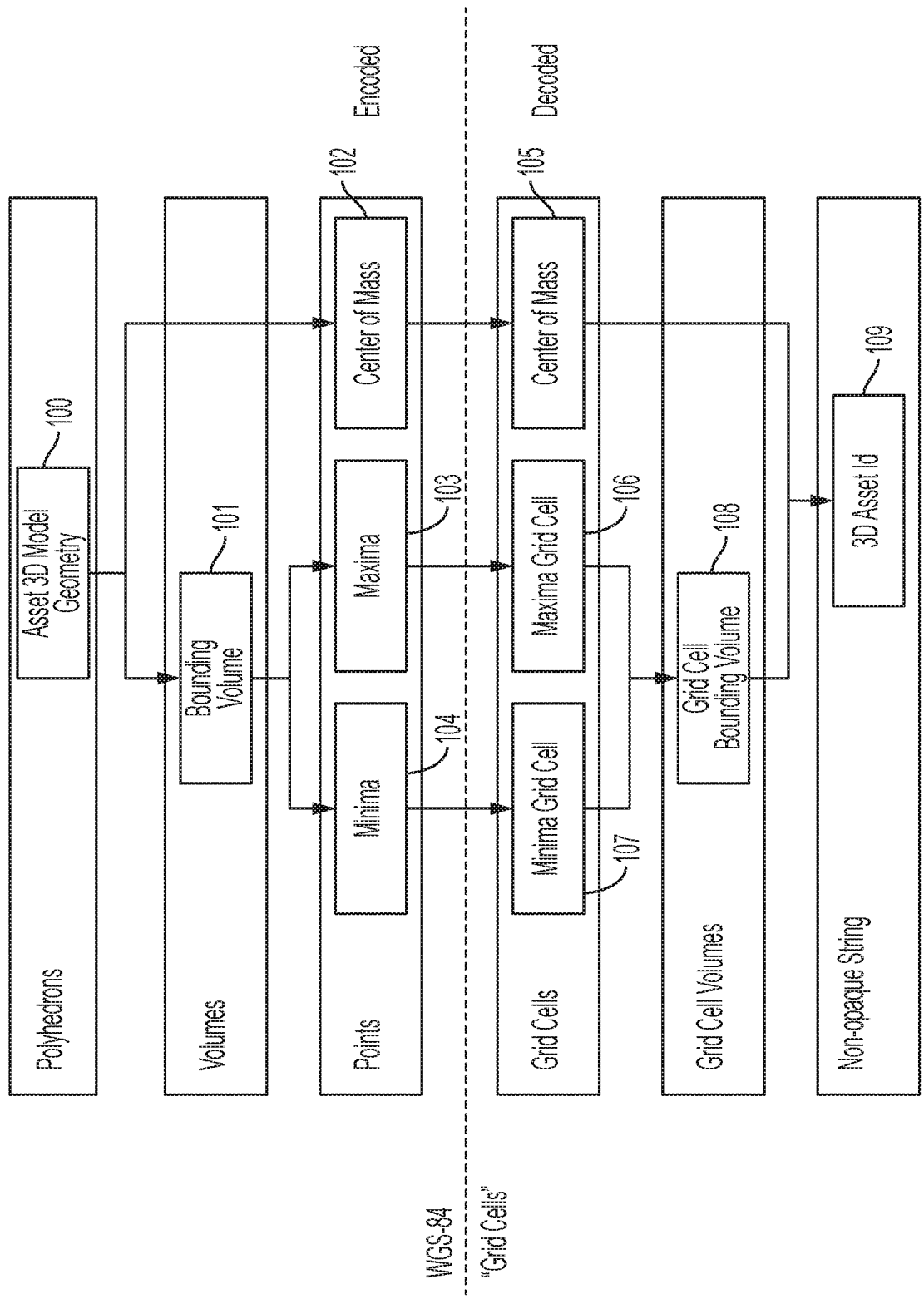
FIG. 1 is a flow diagram depicting one embodiment of the assignment of a 3-dimensional asset identifier to an asset, wherein the dimensions are length, width, and height.

Physical addresses, which have been used for centuries to locate an asset or place in the physical world, become deficient in the digital world. The inventors have observed that addresses are error-prone, lack one-to-one relationship with assets, and do not present any mutual exclusivity relative to another asset or address. Furthermore, there is not a uniform standard and as a result, cultural methodologies for identifying a location may not be clearly understood across ethnicities and languages. Difficulty in computationally joining data from disparate sources in a single location, due to the different ways of identifying assets using names, addresses, or local numbering systems, becomes a major obstacle to information and knowledge exchange and can prevent appropriate analysis and scientific insights.

A variety of approaches has been attempted to address these issues and concerns. Each of these prior approaches has a unique set of limitations that inhibit them from wide spread adoption. Geocoding, for example, is the process of transforming a description of a location, such as coordinates and/or an address, to a location on the earth's surface. A set of latitude and longitude coordinates are commonly used as the equivalent of an asset location, known as geocodes. In the example of buildings, geocodes are traditionally directly linked to the physical address of a building. However, geocodes have similar problems as address, such as buildings with multiple geocodes, multiple buildings sharing a single geocode, or geocodes pointing to the street instead of the building footprint. Google's Place ID is a variation of the geospatial locator approach. It is a geohash code, which encodes latitude and longitude (such as 38.883687 and −77.024437) to a random code (such as ChIJD9mMzXe3t4kR6-FvrqmdTw06gkzwgjzn820) for URLs and machine-to-machine communication. Most importantly, the geohashes are fundamentally a string of random alphanumeric characters and do not provide any geographic or contextual reference. The Place IDs although it is meaningful for a database appears to be random numbers to users. They are examples of opaque strings. The information content of an "opaque" string is merely the string itself. In other words, the capabilities of an "opaque" string are limited to testing if two such strings are either identical or non-identical.

The problem of uniquely identifying assets in space and/or time in a computationally efficient manner can be solved by embedding, or encoding, both position and extents of an asset into a non-opaque string. The position and the extent information are intrinsic to the string. The unique asset identifiers described herein give consideration to feasibility and scalability of adoption and integration. They are easy to adopt and implement, and certain embodiments do not require a centralized database or authority to generate the identifiers. Accordingly, in some embodiments, all information needed to create an identifier is publicly available. Furthermore, following a standard ruleset, multiple entities can generate the same identifier for the particular asset without referring to one another. Another consideration is usability. Although the identifiers described herein are intended primarily for data exchange and not primarily for replacement of an address or name for vernacular asset identification, one can transcribe an asset identifier without any errors or confusion. In some embodiments, identifiers are as short as possible, avoid the use of special characters that are difficult to transcribe (such as "!" "#" "?" and "\"), and not be case sensitive. Identifiers can further allow easy encoding and decoding, which is important for data verification. One can use non-proprietary information to verify an identifier. Such identifiers can be encoded and decoded without a central authority. Hence, they can be verified without a central authority. However, "ownership" of an identifier and the validity of the assignment itself may be determined by a central authority.

Examples of assets, to which an identifier can be assigned include, but are not limited to buildings, floors of buildings, rooms in a building, building HVAC equipment, building electrical equipment, building mechanical equipment, valuable inventory (e.g., supply chain inventory), art artifacts, monuments, important landmarks, buildable areas or volumes, vehicles, telecommunications installations, basic infrastructure installations, and even persons. Examples of building equipment (e.g., HVAC, electrical and/or mechanical) can include, but are not limited to, pumps, motors, generators, air conditioning units, water heaters, photovoltaic panels, elevators, escalators, and networking devices. Examples of basic infrastructure installations can include, but are not limited to roads, bridges, dams, water and sewer system components, railway components, and subway components, airports, harbors, traffic signals, fire hydrants, and transit stations or stops. Examples of telecommunications installations can include, but are not limited to, cellular towers, switching systems, satellite dishes, edge data centers, home energy management gateways for demand response and energy efficiency measurement and verification (M&V), and other network equipment. As used herein, a buildable area or volume can refer to an area or volume defined by a boundary, which can be non-physical. For example, an architectural buildable area is a space defined by local zoning. Similarly, a region to which air rights exist can be encompassed by the term buildable volume.

In one embodiment, a generalized N-dimensional asset identifier can be determined as follows. For each dimension, which must be continuous, establish the minima and maxima. The total extent is, therefore, equal to "maxima−minima". For each dimension, establish the ratio for subdivision. The ratio can be determined according to predetermined and/or fixed values. In one embodiment, a total extent is divided initially by a predetermined value and successive divisions are selected such that each subdivision is divisible by a fixed whole number. For example, a ratio of 1:20 divides the total extent into 20 segments (e.g., grid cells in a grid reference system), each of extent "1/20*(maxima−minima)". Hence, the span of the kth extent is from "minima+((k−1)/20*(maxima−minima))" to "minima+(k/20)*(maxima−minima))". For each dimension, establish an alphabet of symbols to denote each span, e.g., a ratio of 1:20 would require 20 symbols, e.g., 0123456789ABCDEFGHJK. Perform a number of subdivisions and denote the result of each subdivision by the corresponding symbol. The result, for each dimension, is a sequence $X_1$, $X_2$, $X_3$, etc., where, in this case, "X" denotes a given dimension. Establish a notation, e.g., write the sequence of symbols for the first dimension, followed by the sequence of symbols for the second dimension, etc.; or interleave the nth symbol for each dimension. In the case of a time dimension, the "minima" and "maxima" can be epochs. Hence, a "ratio" can correspond to years, months, hours, etc.

The identifiers described herein can be considered representations of information, but are not an assertion of information. The assertion of an asset identifier (and, for example, its association with an asset) is separate from the representation. For example, if an asset identifier incorporates a temporal dimension, then such an identifier would identify the location, spatial extent and temporal extent of the asset. If the asset changes, then the assertion changes (i.e., we assert an association with a different asset identifier). The original asset identifier does not change. Moreover, the temporal extent would be the span (of time) for which the spatial extent holds. In other words, it is not a timestamp (it is a time interval).

Referring to FIG. 1, one embodiment depicting the assignment of a three-dimensional (i.e., N=3) asset identifier to an asset is shown. As illustrated, the dimensions are length, width, and height. Initially, the asset is represented by a three-dimensional spatial model 100, such as a polyhedron. The model can be defined by a user, determined computationally according information provided by a data source, or both via a user-computer interaction. A center of mass position 102 is calculated according to the polyhedron modeling the asset. The center of mass is based on the three-dimensional polyhedron model and not on the bounding polytope or volume. In certain embodiments, the density of the model geometry is assumed to be uniform.

In the illustrated embodiment having three dimensions, the bounding polytope comprises a bounding volume 101 and is defined as a minimum cuboid that encompasses the model geometry. The minima 104 and maxima 103 of the bounding volume for the bounding volume are determined based on predetermined outermost corners. The minima is located at the lowest altitude in a predetermined point of the bounding volume. The maxima is located at the highest altitude in another predetermined point different than that of the minima. The center of mass, maxima, and minima describe the bounding volume that encompasses the model geometry and can be denoted according to a coordinate system. One instance of determining extents in a coordinate system uses a three-dimensional coordinate system comprising latitude, longitude, and altitude. The minima can be the lowest altitude in the southwest corner of a bounding volume and the maxima can be the highest altitude in the northeast corner of the bounding volume.

Based on a grid reference system covering the surface of the Earth, each of the center of mass, maxima, and minima can then be converted to a grid cell containing each respective point 105, 106, and 107. The volume of the bounding volume 108, or a representation thereof, is also determined based on the grid reference system. In the instance from the previous paragraph, the extents from the grid cell containing the center of mass to the grid cells lying on the faces of the bounding volume in north, south, east, west, upper, and lower directions from the center of mass are measured on the basis of the number of grid cells.

The three-dimensional asset identifier 109 is encoded based on the center of mass, the maxima, the minima, and the six extents. In the instant example, the minimum number of values used in the three-dimensional asset identifier is fifteen: three dimension values for each of the center of mass, maxima, and minima grid cells and six values for the north, south, east, west, upper, and lower extents.

In some embodiments, the grid reference system comprises an n-orthotopic (i.e., hyperrectangular) grid reference system. In certain embodiments, the grid reference system implementation can be based on an arbitrary functor, a type that can be mapped over (viz., for each value, the application of a function derives a new value), wherein a variety of functors is the one-parameter semigroup of length-n vectors (each length, the value of the parameter, n, is a distinct functor; and two vectors of length-i and length-j respectively may be concatenated to yield a new vector of length-(i+j)). A three-dimensional orthotope can be called a rectangular prism. In certain embodiments, grid reference systems described herein decouple the computation and presentation of the identifier string. Such embodiments allow for the ordering and/or re-ordering of the values in a string to facilitate compatibility between different sources each generating identifier, the appending of values associated with added functionality to an identifier string, or both. In certain embodiments, the n-orthotopic grid reference system comprises, length, width, and height. In certain embodiments, the grid system comprises uniform, non-overlapping grid cells and overlays at least a portion of Earth's surface. Each position within the portion of the Earth's surface can be within exactly one grid cell and has one unit of extent in length, width, and height dimensions. Every position within the "portion" lies within exactly one grid cell, and therefore has one unit of extent in every dimension. One grid cell may contain many positions.

In one example, consider a three-dimensional grid covering the surface of the Earth and subdividing the surface into three-dimensional volumetric elements (viz., voxels). All grid cells lie on the same manifold (viz., the surface of the Earth) and each grid cell can be said to have dimensions of X×Y×Z, where Z is the total vertical span (i.e., the unit height). X and Y can have extents according to a predetermined definition. For example, X and Y can each be $\frac{1}{20}$ of the total length span and $\frac{1}{20}$ of the total width span, respectively. If Z (height) is defined as a fraction of the total vertical span, then the grid system can be subdivided in the Z (height) direction. For example, a minimum and maximum height can be predefined, thereby setting the maximum vertical span of a stratum. The stratum can then also be subdivided hierarchically to increase resolution.

Traditional grid reference systems are not compatible with dimensionality that is greater than 2. For example, some grid systems interleave the values for X and Y in their calculation. The addition of a Z value would interfere with functionality of strings generated with such 2D grid systems. In such instances, embodiments described herein can append the Z values to the end of a string in which X and Y values are interleaved. In these embodiments, a lower dimensional encoding can be recovered by eliding the additional dimensions. For example, the Z dimension can be elided from the three-dimensional encoding. One example follows, where $X_k$ denotes the kth character in the string encoding of the X value, $Y_k$ denotes the kth character in the string encoding of the Y value, and $Z_k$ denotes the kth character in the string encoding of the Z value.

$$X_1Y_1X_2Y_2 \ldots X_iY_i \ldots Z_1Z_2 \ldots Z_i$$

Second, consider non-unit values for the extent of the third dimension. To locate an arbitrary point within a three-dimensional grid requires that the minimum and maximum heights of the grid be fixed, and subsequently, subdivided. In certain embodiments, points that lie outside of the minimum and/or maximum height are not encoded.

In some embodiments, the non-opaque code string can be reduced by one or more dimensions by removing the symbols and extents associated with the one or more dimensions. In certain embodiments, any symbol not associated with dimensions of length and width are removed.

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, molecular weights, percentages, temperatures, times, and so forth, as used in the specification or claims are to be understood as being modified by the term "about." Accordingly, unless otherwise implicitly or explicitly indicated, or unless the context is properly understood by a person of ordinary skill in the art to have a more definitive construction, the numerical parameters set forth are approximations that may depend on the desired properties sought and/or limits of detection under standard test conditions/methods as known to those of ordinary skill in the art. When directly and explicitly distinguishing embodiments from discussed prior art, the embodiment numbers are not approximates unless the word "about" is recited.

To facilitate review of the various embodiments of the disclosure, the following explanations of specific terms are provided:

As used herein, an asset's location is a "pure math" point on a manifold (e.g., Euclidean space). An asset's position is a representation of its location using a coordinate system or a grid system. The "center of mass" of an asset can refer to the mean position of the matter in the asset. The matter can be assumed to have uniform density. The center of mass is determined based on the asset's geometry in N-dimensions. The geometry of the asset can be modeled with a predetermined error tolerance in order to satisfy resolution requirements. The center of mass is not determined from a bounding polytope encompassing the asset. In certain embodiments, the bounding polytope is the minimum n-polytope that encompasses the n-dimensional model of the asset. The center of mass is not necessarily within the polytope. The asset's geometry can be represented by a model. For example a building can be represented by a rectangular box or group of rectangular boxes in three dimensions (i.e., length, width, height).

A grid reference system defines locations on maps using grid cells and can be based on a coordinate system. A grid reference locates a unique region on the map. Examples include Universal Transverse Mercator (UTM), Universal Polar Stereographic (UPS), Military Grid Reference System (MGRS), and the United States National Grid (USNG). The advantage of grid reference systems, as described herein, over latitude and longitude is that a grid reference code is not a single point map projection. In other words, it can be used to represent an n-dimensional space, not merely a single point. In embodiments described herein, Earth is hierarchically divided into a grid of various shapes and sizes. Similarly, time as a dimension can be hierarchically divided into periods of various durations. For example, time is considered a dimension in Minkowski spacetime, wherein three-dimensional Euclidean space and time are combined into a four-dimensional manifold where the spacetime interval between any two events is independent of the inertial frame of reference in which they are recorded.

In the context of comparing a plurality of asset identifiers, functional equivalence for a given unary function f (an N-dimensional asset identifier encoding function) and a binary function g (a Boolean-valued, asset identifier "is a match" criteria function) is to say that "g(f(x), f(y))=TRUE." In one analogy, for two geometries, x and y, equivalence/equality is akin to saying that x=y. Direct comparison of geometries is inefficient and/or impractical. First, note that two shapes are said to be equal if they share all interior points. However, consider the definition of the geometry for a given shape as sequence of points that define its exterior ring. The set of interior points is preserved if the sequence is reversed; however, the definitions of the "forwards" and "reversed" sequences are not equal. Given the above, computation of this equivalence would require the enumeration of all points within x, all points within y, and then point-by-point comparison; a computationally expensive operation. Accordingly, embodiments of the N-dimensional asset identifiers having the characteristic of being comparable for functional equivalence against other asset identifiers as described herein is an unexpected benefit that has been determined by the inventors.

Non-transitory as used herein when referring to a computer-accessible medium, is a limitation of the medium itself (i.e., tangible, not a propagating electromagnetic signal) as opposed to a limitation on data storage persistency. The term is not intended to otherwise limit the type of physical computer-readable storage device that is encompassed by the phrase computer-accessible medium or memory. For instance, the terms "non-transitory computer readable medium" or "tangible memory" are intended to encompass types of storage devices that do not necessarily store information permanently, including but not limited to, computer-readable media that store data only for short periods of time and/or only in the presence of power, such as register memory, processor cache and Random Access Memory (RAM). Program instructions and data stored on a tangible computer-accessible storage medium in non-transitory form may further be transmitted by transmission media or signals such as electrical, electromagnetic, or digital signals, which may be conveyed via a communication medium such as a network and/or a wireless link.

Figure 2:
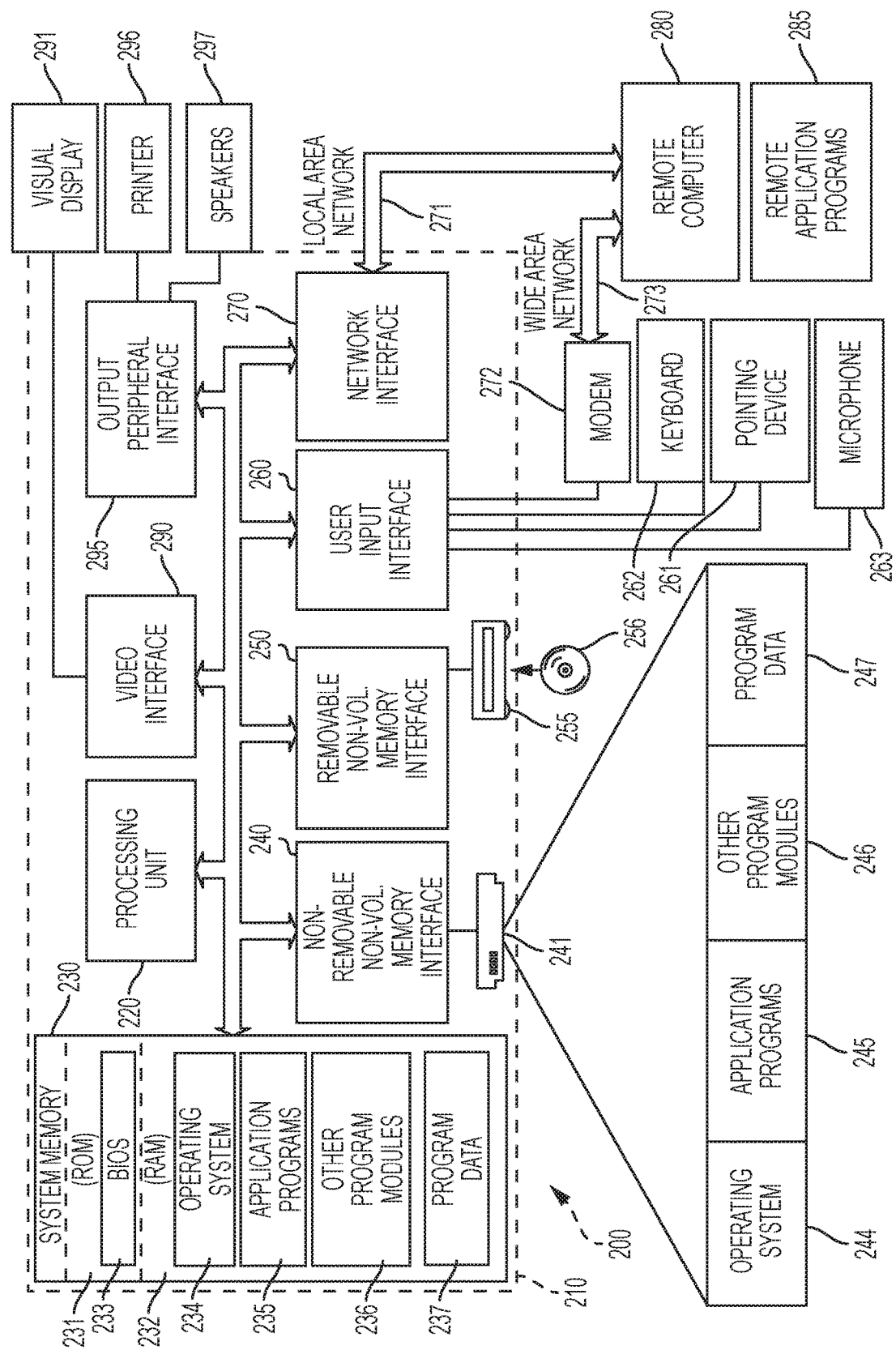
FIG. 2 is an illustration representing one embodiment of a computational system for assigning an N-dimensional asset identifier to an asset.

FIG. 2 is one embodiment of a computing environment by which an N-dimensional asset identifier can be computed and/or analyzed. In one example, a computing environment such as shown in FIG. 2 can be used to process asset related information and assign an N-dimensional asset identifier to the asset. For example, an asset model geometry 100 can be received as input via the network interface 270, or via the removable non-volatile memory interface 250. Alternatively, the model geometry can be stored in the non-removable, non-volatile memory interface. The processing unit 220 can be used to determine a bounding polytope 101, a center of mass 102, a maxima 103, and a minima 102. The processing unit 220 can further be used to convert into the grid system the bounding polytope 108, the center of mass 105, the maxima 106, and the minima 107. The processing unit 220 can also be used to encode the appropriate grid cells into a non-opaque code string as the asset identifier 109.

With reference to FIG. 2, an example system for implementing some embodiments includes a general-purpose computing device in the form of a computer 210. Components of computer 210 may include, but are not limited to, a processing unit 220 (which is not limited to CPUs, but can comprise GPUs), a system memory 230, and a system bus 221 that couples various system components including the system memory to the processing unit 220. The system bus 221 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus. Memory and programs described herein be deployed in corresponding portions of FIG. 2.

Computer 210 typically includes a variety of computer readable media. Computer readable media can be any available media that can be accessed by computer 210 and includes both volatile and nonvolatile media, removable and non-removable media. By way of example, and not limitation, computer readable media may comprise computer storage media and communication media. Computer storage media is different from, and does not include, a modulated data signal or carrier wave. It includes hardware storage media including both volatile and nonvolatile, removable and non-removable media implemented in any method or technology for storage of information such as computer readable instructions, data structures, program modules or other data. Computer storage media includes, but is not limited to, RAM, ROM, EEPROM, sash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 210. Communication media typically embodies computer readable instructions, data structures, program modules or other data in a transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 230 includes computer storage media in the form of volatile and/ or nonvolatile memory such as read only memory (ROM) 231 and random-access memory (RAM) 232. A basic input/output system 233 (BIOS), containing the basic routines that help to transfer information between elements within computer 210, such as during startup, is typically stored in ROM 231. RAM 232 typically contains data and/ or program modules that are immediately accessible to and/ or presently being operated on by processing unit 220. By way of example, and not limitation, FIG. 2 illustrates operating system 234, application programs 235, other program modules 236, and program data 237.

The computer 210 may also include other removable/nonremovable volatile/nonvolatile computer storage media. By way of example only, FIG. 2 illustrates a hard disk drive 241 that reads from or writes to non-removable, nonvolatile magnetic media, and an optical disk drive 255 that reads from or writes to a removable, nonvolatile optical disk 256 such as a CD ROM or other optical media. Other removable/non-removable, volatile/nonvolatile computer storage media that can be used in the exemplary operating environment include, but are not limited to, magnetic tape cassettes, sash memory cards, digital versatile disks, digital video tape, solid state RAM, solid state ROM, and the like. The hard disk drive 241 is typically connected to the system bus 221 through a nonremovable memory interface such as interface 240, and optical disk drive 255 are typically connected to the system bus 221 by a removable memory interface, such as interface 250.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Application-specific Standard Products (ASSPs), System-on-a-chip systems (SOCs), Complex Programmable Logic Devices (CPLDs), etc.

The drives and their associated computer storage media discussed above and illustrated in FIG. 2, provide storage of computer readable instructions, data structures, program modules and other data for the computer 210. In FIG. 2, for example, hard disk drive 241 is illustrated as storing operating system 244, application programs 245, other program modules 246, and program data 247. Note that these components can either be the same as or different from operating system 234, application programs 235, other program modules 236, and program data 237. Operating system 244, application programs 245, other program modules 246, and program data 247 are given different numbers here to illustrate that, at a minimum, they are different copies.

A user may enter commands and information into the computer 210 through input devices such as a keyboard 262, a microphone 263, and a pointing device 261, such as a mouse, trackball or touch pad. Other input devices (not shown) may include a joystick, game pad, satellite dish, scanner, or the like. These and other input devices are often connected to the processing unit 220 through a user input interface 260 that is coupled to the system bus, but may be connected by other interface and bus structures, such as a parallel port, game port or a universal serial bus (USB). A visual display 291 or other type of display device is also connected to the system bus 221 via an interface, such as a video interface 290. Video interface 290 can comprise a graphics card having a GPU. The GPU can be used for computations. In addition to the monitor, computers may also include other peripheral output devices such as speakers 297 and printer 296, which may be connected through an output peripheral interface 295.

The computer 210 is operated in a networked environment using logical connections to one or more remote computers, such as a remote computer 280. The remote computer 280 may be a personal computer, a hand-held device, a server, a router, a network PC, a peer device or other common network node, and typically includes many or all of the elements described above relative to the computer 210. The logical connections depicted in FIG. 2 include a local area network (LAN) 271 and a wide area network (WAN) 273, but may also include other networks. Such networking environments are commonplace in offices, enterprise-wide computer networks, intranets and the Internet.

When used in a LAN networking environment, the computer 210 is connected to the LAN 271 through a network interface or adapter 270. When used in a WAN networking environment, the computer 210 typically includes a modem 272 or other means for establishing communications over the WAN 273, such as the Internet. The modem 272, which may be internal or external, may be connected to the system bus 221 via the user input interface 260, or other appropriate mechanism. In a networked environment, program modules depicted relative to the computer 210, or portions thereof, may be stored in the remote memory storage device. By way of example, and not limitation, FIG. 2 illustrates remote application programs 285 as residing on remote computer 280. It will be appreciated that the network connections shown are exemplary and other means of establishing a communications link between the computers may be used.

Examples and Comparisons

To further illustrate certain embodiments of the disclosed cathode materials, cathodes, battery systems and methods of making the same, and to provide various comparative analyses and data, below are some Examples with comparison test data.

N-Dimensional Asset Identifier with a Suffix for N=3, L×W×H

Figure 3A:
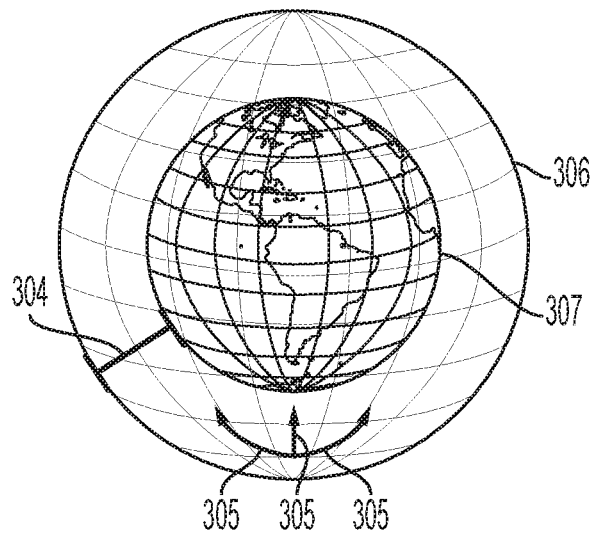
FIGS. 3A-3C are illustrations depicting various views of an embodiment of a grid reference system.
Figure 3B:
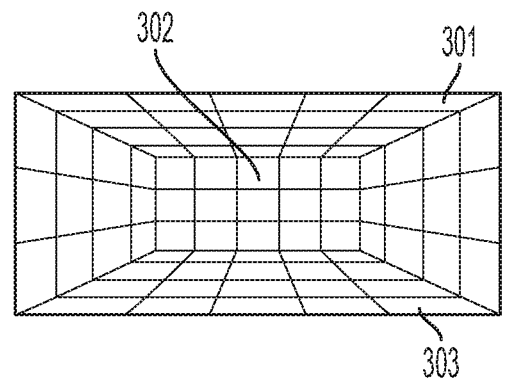
Figure 3C:
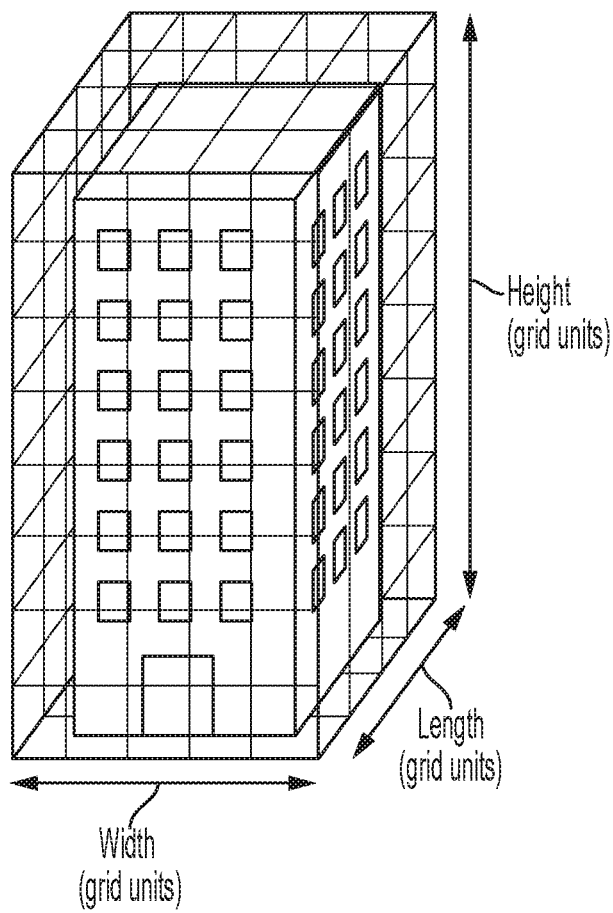
Figure 4:
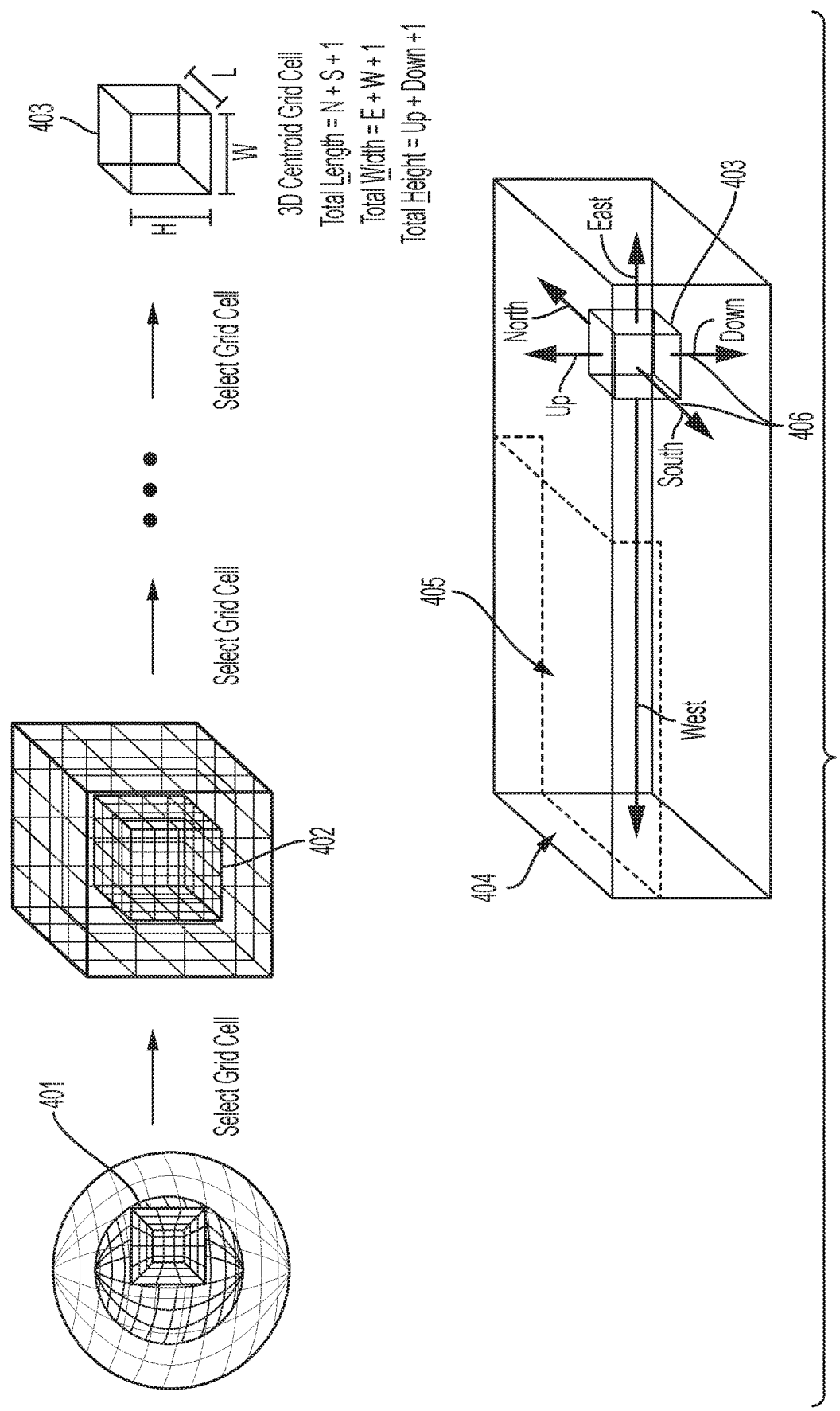
FIG. 4 is an illustration depicting a logical flow for determining a grid cell in a grid reference system, which grid cell contains a center of mass.

An example of a grid reference system in three dimensions is illustrated in FIGS. 3A-3C. In FIG. 3A, a surface level of the Earth 307 establishes a minima. The surface level 307 can be at ground level, above ground, or below ground. A sky level 306 is higher in altitude than the surface level 307 and establishes a maxima. The difference between the sky level and surface level determines the total height extent 304. Radial directions are normal to width and length aspects of the grid reference system. FIG. 3B is a top-down plan view of a volume depicting portions of the grid system. The total height extent exists between the sky level 303 and the surface level 301. Surface-to-sky normals 301 can connect lateral grid points between the surface and sky levels. A three dimensional asset can be contained within a bounding volume described by the grid reference system. FIG. 3 is an example of a three-dimensional bounding volume encompassing a building (i.e., asset). FIG. 4 illustrates a logical flow for certain embodiments described herein. A first grid cell 401 comprising a rectangular polygon can be successively reduced in size 402, thereby increasing resolution, to identify a grid cell 403 containing the center of mass of an asset. From the center-of-mass grid cell 403, extents 406 to north, south, east, west, up and down surfaces of a bounding volume 404 can be determined. The bounding volume 404 is the minimum rectangular polygon encompassing an asset's modeled geometry 405.

Figure 5:
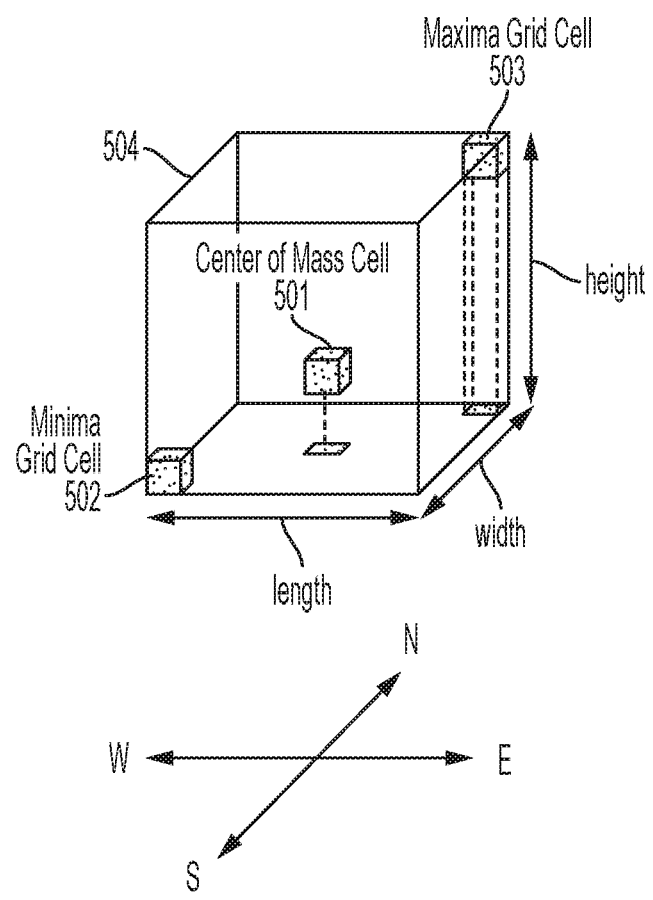
FIG. 5 is a schematic of one example of a bounding polytope, a center of mass, a maxima, and a minima for an asset.

Referring to FIG. 5, the center of mass 501, minima 502, and maxima 503 points have height (i.e., altitude) values and require nine numbers to be specified. Six extents must be expressed to specify the extents in the north, south, east, west, upward and downward directions from the center of mass. Accordingly, the non-opaque asset identifier contains the following segment, wherein C is the center of mass of the asset geometry and n, e, s, w, up, and down are extents in the north, east, south, west, upward, and downward directions measured from the center of mass to the rectangular bounding volume.

C-n-e-s-w-up-down

In the instant example, the asset identifier code string "C-n-e-s-w" uses hyphens "-" to separate the individual string segments. In certain embodiments, a second separator character is used, for example, forward slash "/" or dollar "$" symbols. The code string is appended to include additional information, for example, as a suffix. Preferably, a symbol for the separator that is not present in the asset identifier code string is selected, and the original asset identifier code string can be recovered as a string prefix. Hence, all established methods and algorithms for analysis of the asset identifier code string are unaffected, and hence, the extended asset identifer is said to be backwards compatible with the original asset identifier code string.

A non-limiting example of a suffix includes Uniform Resource Identifiers (URIs). This would make the N-dimensional asset identifier code strings amenable to software-based manipulation and integration with other knowledge management systems. For example, suppose that a URI scheme is defined for floor names and numbers in an asset comprising a building. The N-dimensional asset identifier code string may be C-n-e-s-w$urn:buildingid:floor:A where "urn:buildingid:floor:" is the URI scheme and prefix, and "A" is the floor name.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

What is claimed is:

1. A method of assigning an n-dimensional asset identifier to an asset comprising:
   determining a position of the asset in n dimensions (n≥3), wherein the position is based at least on the center of mass of the asset's modeled geometry;
   determining an extent for each of the n dimensions, wherein each extent is measured from the center of mass to a surface of an n-dimensional bounding polytope containing the asset;
   encoding the position and the extents of the asset into a single, non-opaque, code string capable of being stored on computer-readable media
   referencing the position and extents to a grid reference system having n-dimensions, wherein the grid reference system comprises uniform, non-overlapping grid cells and overlays at least a portion of Earth's surface wherein each position within the portion of the Earth's surface is within exactly one grid cell and the n dimension of the grid system is height;
   defining a stratum as a span between a fixed minimum height and a fixed maximum height at a higher altitude than the minimum height, wherein no polytope extends outside the stratum; and
   sub-dividing the stratum into nested layers, wherein increasingly nested layers correspond to finer resolutions.

2. The method of claim 1, wherein the asset is a building, a floor of a building, a room in a building, building HVAC equipment, building electrical equipment, building mechanical equipment, valuable inventory, an art artifact, a monument, a landmark, a buildable area or volume, a vehicle, a telecommunications installation, a basic infrastructure installation, a person, or a combination thereof.

3. The method of claim 1, further comprising contributing one symbol to the non-opaque code string for each nested layer.

4. The method of claim 1, wherein the polytope is a hyperrectangle.

5. The method of claim 1, wherein the n dimension further comprises length and width.

6. The method of claim 5, wherein the n dimension further comprises time.

7. A method of assigning an n-dimensional asset identifier to an asset comprising:
   defining a stratum as a span between a fixed minimum height and a fixed maximum height at a higher altitude than the minimum height;
   sub-dividing the stratum into nested layers, wherein increasingly nested layers correspond to finer resolutions;
   determining from a map, a position of the asset in n dimensions (n≥3) comprising length, width, and height, wherein the position is based on the center of mass of the asset's geometry;
   determining an extent for each of the dimensions, wherein each extent is measured from the center of mass to a surface of an n-dimensional bounding hyperrectangle containing the asset, wherein no bounding hyperrectangle extends outside the stratum;
   referencing the position and extents to a grid system having n-dimensions, wherein the grid system comprises uniform, non-overlapping grid cells and overlays at least a portion of Earth's surface; and
   encoding the position and the extents of the asset into a single, non-opaque, code string that can be stored on computer-readable media, wherein the code string does not encode the asset's geometry and wherein two non-opaque, code strings are directly comparable for functional equivalence.

8. A non-transitory computer readable storage medium storing one or more programs, the one or more programs comprising instructions, which when executed by one or more processors of an electronic device cause the device to:
   determine a position of an asset in n dimensions (n≥3), wherein the position is based at least on the center of mass of the asset's geometry;
   determine an extent for each of the n dimensions, wherein each extent is measured from the center of mass to a surface of an n-dimensional bounding polytope containing the asset;
   encode the position and the extents of the asset into a single, non-opaque, code string that is a computer-readable, n-dimensional identifier of the asset;
   store programs comprising instructions, which when executed further cause the electronic device to reference the position and extents to a grid reference system having n-dimensions, wherein the grid system comprises uniform, non-overlapping grid cells and overlays at least a portion of Earth's surface, wherein one of the n dimensions of the grid system is height which defines a stratum as a span between a fixed minimum height and a fixed maximum height at a higher altitude than the minimum height, wherein no polytope extends outside the stratum; and
   sub-divide the stratum into nested layers, wherein increasingly nested layers correspond to finer resolutions.

9. The non-transitory computer readable storage medium of claim 8, wherein the n dimensions further comprise length, width, and time.

10. The non-transitory computer readable storage medium of claim 8, wherein the instructions, which when executed cause the electronic device to encode the position and the extents of the asset into a single, non-opaque, code string do not encode the asset's geometry into the non-opaque, code string.

11. The non-transitory computer readable storage medium of claim 8, wherein the instructions, when executed further cause the electronic device to concatenate the non-opaque code string by removing any symbol not associated with dimensions of length and width.

* * * * *